(12) United States Patent
Hou et al.

(10) Patent No.: US 10,588,224 B2
(45) Date of Patent: Mar. 10, 2020

(54) FLUID DRAINING STRUCTURE AND TOUCH DEVICE HAVING THE SAME

(71) Applicant: Wistron Corporation, New Taipei (TW)

(72) Inventors: Chia-Chang Hou, New Taipei (TW); Po-Liang Huang, New Taipei (TW)

(73) Assignee: Winston Corporation, New Taipei (TW)

( * ) Notice: Subject to any disclaimer, the term of this patent is extended or adjusted under 35 U.S.C. 154(b) by 69 days.

(21) Appl. No.: 15/805,108

(22) Filed: Nov. 6, 2017

(65) Prior Publication Data
US 2019/0008058 A1   Jan. 3, 2019

(30) Foreign Application Priority Data
Jun. 29, 2017 (TW) .............................. 106121792 A

(51) Int. Cl.
G06F 1/16 (2006.01)
H05K 5/02 (2006.01)
G06F 3/042 (2006.01)
H05K 5/00 (2006.01)
G06F 3/041 (2006.01)

(52) U.S. Cl.
CPC .......... H05K 5/0217 (2013.01); G06F 1/1601 (2013.01); G06F 1/1656 (2013.01); G06F 3/0418 (2013.01); G06F 3/0421 (2013.01); H05K 5/0017 (2013.01)

(58) Field of Classification Search
CPC .......... G06F 1/1656; H05K 5/02; G09F 15/00
USPC ............................... 40/624; 361/679.26, 829
See application file for complete search history.

Primary Examiner — Abdul-Samad A Adediran
(74) Attorney, Agent, or Firm — Winston Hsu

(57) ABSTRACT

A fluid draining structure adapted for a border having a first surface includes a plurality of draining ribs spaced at intervals on the border. Each of the plurality of draining ribs includes a first draining segment located above the first surface and spaced from the first surface at a first distance. The first surface and a side of the first draining segment adjacent to the first surface are inclined downwardly relative to a horizontal direction, and a droplet is drawn to the corresponding draining rib and drained along the corresponding draining rib after the droplet falls on the first surface.

26 Claims, 7 Drawing Sheets

FLUID DRAINING STRUCTURE AND TOUCH DEVICE HAVING THE SAME

BACKGROUND OF THE INVENTION

1. Field of the Invention

The present invention relates to a fluid draining structure, and more particularly, to a fluid draining structure disposed on a border for draining droplets on the border and a touch device having the same.

2. Description of the Prior Art

With advance of technology, touch modules are widely used in different fields for providing intuitive and interactive experience for users. For example, compared with a conventional vending machine or billboard, a vending machine with a touch module or a digital electronic billboard with a touch module can not only bring convenience in providing selling or advertising services but also achieve a better marketing effect by catching customers' attention via interactive touch technology. However, vending machines or digital electronic billboards are usually located outdoors. A touch module of a vending machine or a digital electronic billboard is usually an optical touch module disposed in a frame of a display panel. The optical touch module can include cameras or infrared sensors for detecting a touch location of a touch object according to shielding portions of reflective bars or light bars on borders of the frame. When there is rain or water spilled on the display panel, droplets are accumulated on the frame, especially on a lower border of the frame, so that it interferes with optical characteristics of the reflective bars or the light bars, which may lead to malfunction of the conventional touch module.

SUMMARY OF THE INVENTION

Therefore, the present invention provides a fluid draining structure disposed on a border for draining droplets on the border and a touch device having the same for at least solving the aforementioned problems.

According to an embodiment of the present invention, the present invention discloses a fluid draining structure adapted for a border having a first surface, and the fluid draining structure includes a plurality of draining ribs spaced at intervals on the border. Each of the plurality of draining ribs includes a first draining segment located above the first surface and spaced from the first surface at a first distance. The first surface and a side of the first draining segment adjacent to the first surface are inclined downwardly relative to a horizontal direction, and a droplet being drawn to the corresponding draining rib and drained along the corresponding draining rib after the droplet falls on the first surface.

According to an embodiment of the present invention, the present invention further discloses a touch device including a touch panel module and a fluid draining structure. The touch panel module includes a display panel, a frame surrounding a periphery of the display panel, and at least one touch detecting module. The frame includes a lower border having a first surface. The fluid draining structure is for draining fluid accumulated on the lower border, and the fluid draining structure includes a plurality of draining ribs spaced at intervals on the lower border. Each of the plurality of draining ribs includes a first draining segment located above the first surface and spaced from the first surface at a first distance. The first surface and a side of the first draining segment adjacent to the first surface are inclined downwardly relative to a horizontal direction, and a droplet being drawn to the corresponding draining rib and drained along the corresponding draining rib after the droplet falls on the first surface.

In summary, the fluid draining structure of the present invention drains droplets on the border by gravity and capillary phenomenon generated between the plurality of draining ribs and the border, which prevents malfunction of the touch panel module caused by droplets on the border. Therefore, the touch device of the present invention can be placed outdoors. Even if there is rain or water spilled on the touch device, the touch panel module can operate normally by drainage of droplets on the border.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
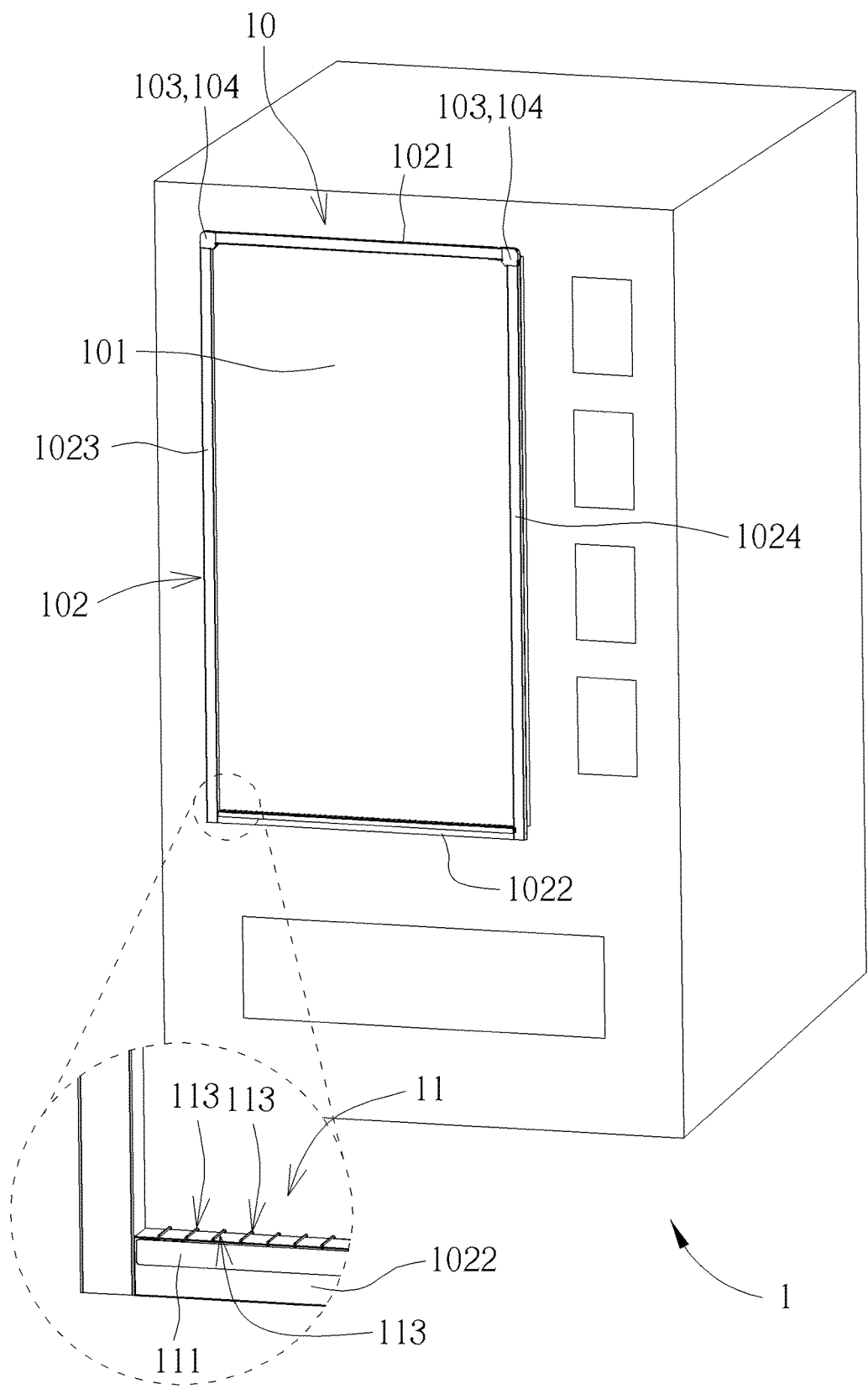
FIG. 1 is a schematic diagram of a touch device according to a first embodiment of the present invention.
Figure 2:
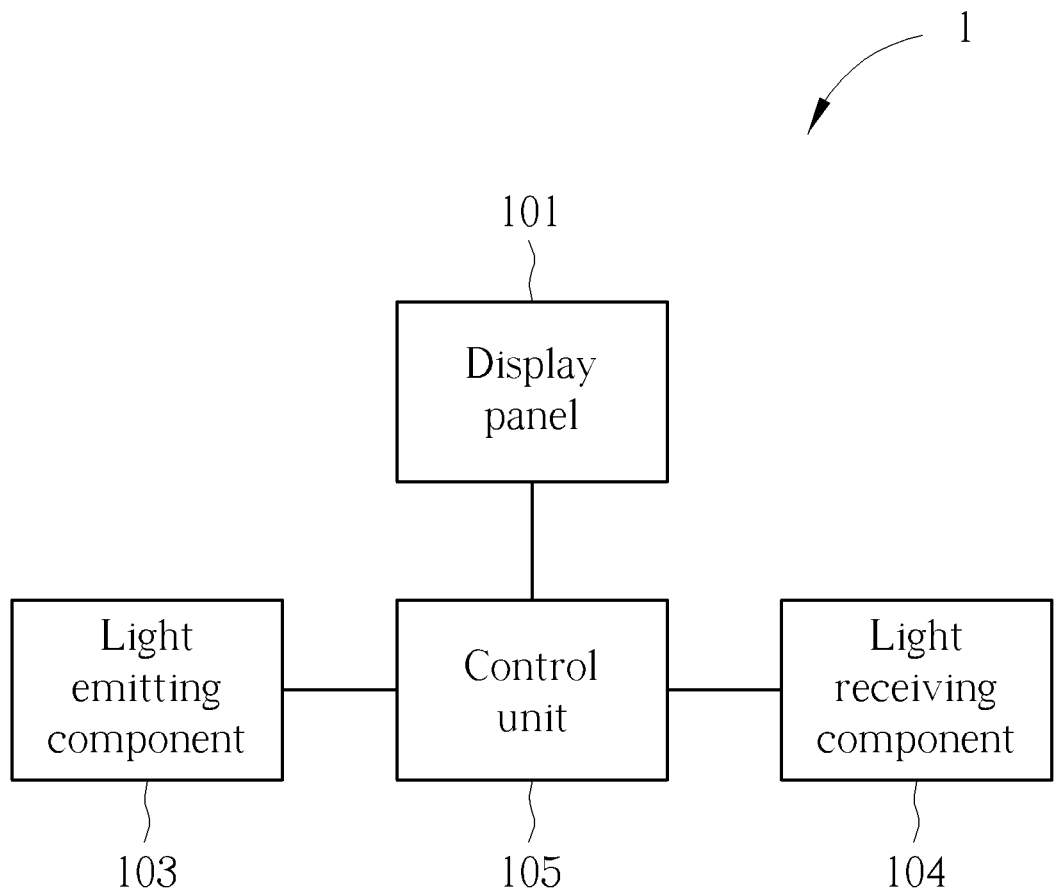
FIG. 2 is a functional block diagram of the touch device according the first embodiment of the present invention.

Please refer to FIG. 1 and FIG. 2. FIG. 1 is a schematic diagram of a touch device 1 according to a first embodiment of the present invention. FIG. 2 is a functional block diagram of the touch device 1 according to the first embodiment of the present invention. As shown in FIG. 1 and FIG. 2, the touch device 1 includes a touch panel module 10 and a fluid draining structure 11. In this embodiment, the touch panel module 10 can include a display panel 101, a frame 102 surrounding a periphery of the display panel 101, two optical touch detecting assemblies, and a control unit 105. Each of the two optical touch detecting assemblies includes a light emitting component 103 and a light receiving component 104. The control unit 105 is electrically connected to the display panel 101, the two light emitting components 103, and the two light receiving components 104 for controlling operation of the touch panel module 10. The frame 102 includes an upper border 1021, a lower border 1022, a left border 1023, and a right border 1024. The upper border 1021 is opposite to the lower border 1022. The left border 1023 is opposite to the right border 1024. A surface of each border facing the display panel 101 can be attached or coated with a reflective layer for reflecting light. In this embodiment, droplets may be formed from falling fluid on a lower edge of the frame 102, i.e., the lower border 1022 because fluid flows from a higher level to a lower level. Therefore, the fluid draining structure 11 can preferably be disposed on the lower border 1022 of the frame 102 for draining droplets on the lower border 1022. However, the fluid draining structure 11 also can be disposed on another border of the frame 102, which depends on actual demands.

Furthermore, the two optical touch detecting assemblies can be disposed at the corner of the upper border 1021 and the left corner 1023 and at the corner of the upper border 1021 and the right corner 1024, respectively. The control unit 105 is electrically connected to the two light emitting components 103 and the two light receiving components 104. When the control unit 105 controls the two light emitting components 103 to emit detecting light toward the frame 102, the reflective layer on each border of the frame 102 can reflect the detecting light emitted from the two light emitting components 103 to the two light receiving components 104. The two light receiving components 104 output analog signals to the control unit 105 according to the detecting light reflected from the reflective layers. The control unit 105 converts the analog signals of the two optical touch detecting assembly into digital signals and calculates a coordinate position of a dark point corresponding to a touch object. Therefore, the control unit 105 can execute touch operation according to the coordinate position of the dark point. However, the touch panel module 10 and the fluid draining structure 11 are not limited to this embodiment. It depends on practical demands. For example, in another embodiment, each border of the frame 102 can be provided with a light guiding bar instead of the reflective layer. The two light emitting components 103 emit light into the light guiding bars, so that the light guiding bars can emit uniform detecting light. Furthermore, in another embodiment, the fluid draining structure 11 also can be disposed on any one of the upper border 1021, the left border 1023, and the right border 1024. It depends on practical demands.

Figure 3:
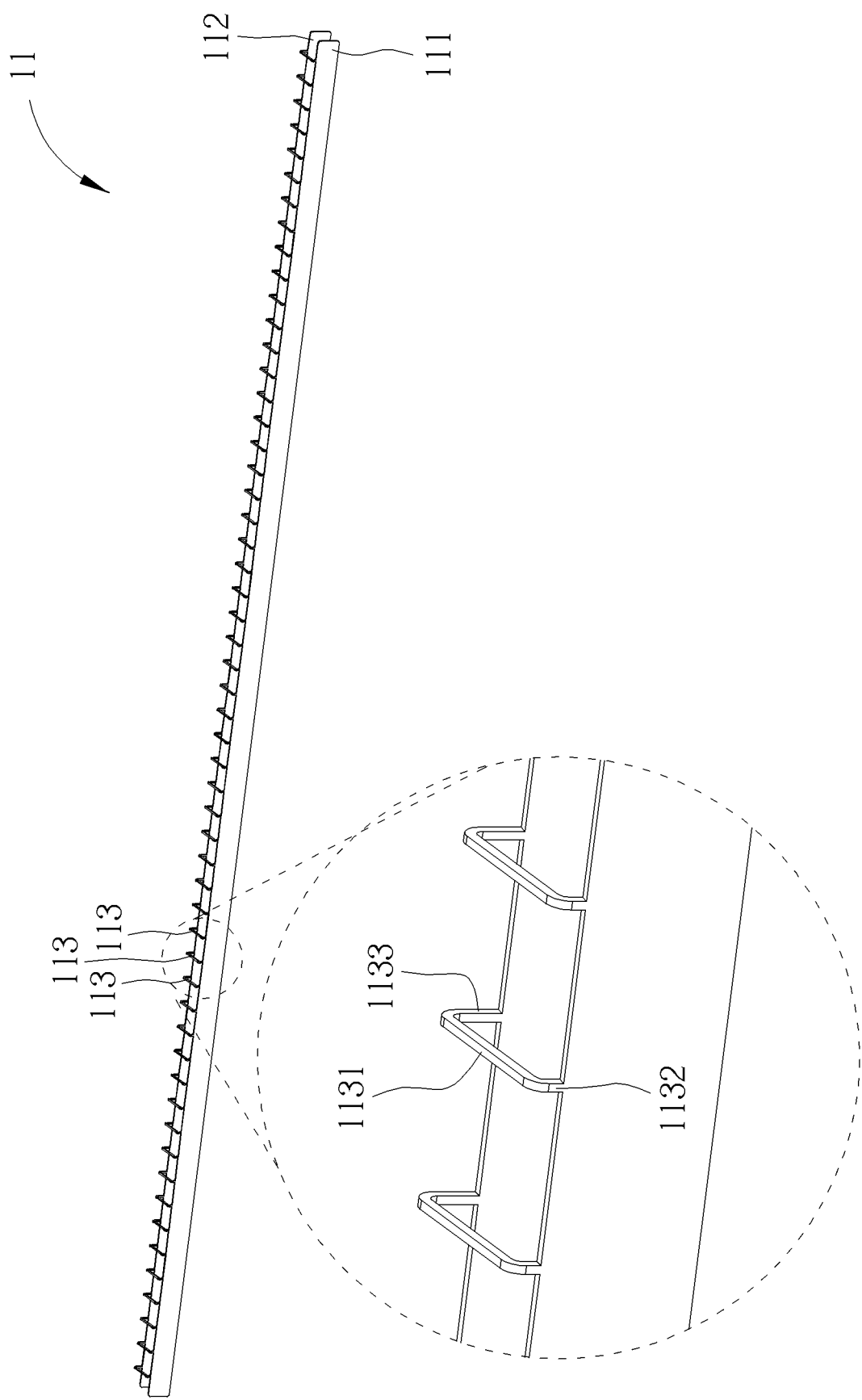
FIG. 3 is a diagram of a fluid draining structure according to the first embodiment of the present invention.
Figure 4:
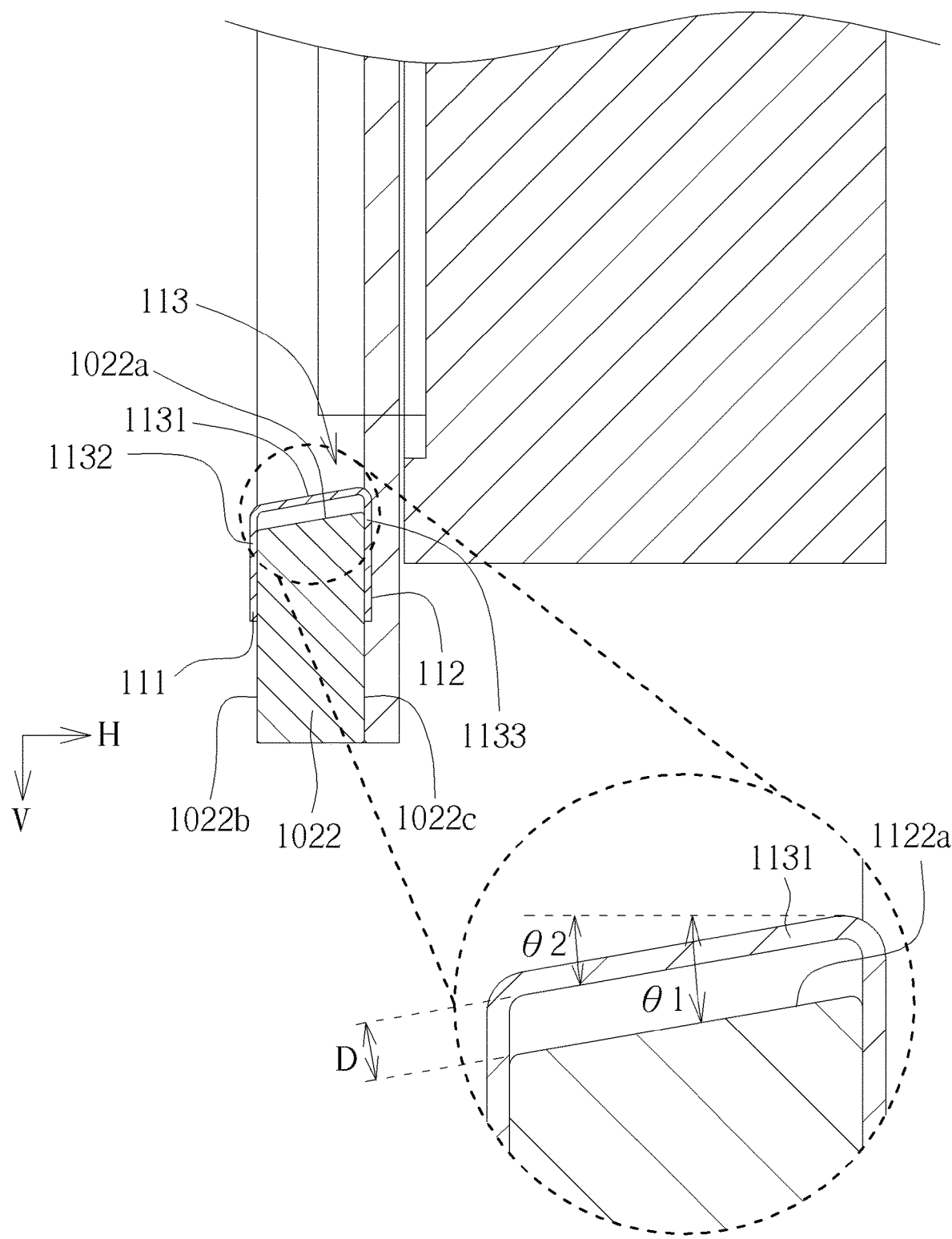
FIG. 4 is a partial sectional diagram of the touch device according to the first embodiment of the present invention.

Please refer to FIG. 3 and FIG. 4. FIG. 3 is a diagram of the fluid draining structure 11 according to the first embodiment of the present invention. FIG. 4 is a partial sectional diagram of the touch device 1 according to the first embodiment of the present invention. As shown in FIG. 3 and FIG. 4, the fluid draining structure 11 can be made of metal material, such as stainless steel, or plastic material. The fluid draining structure 11 includes a first connecting portion 111, a second connecting portion 112, and a plurality of draining ribs 113. The plurality of draining ribs 113 is connected between the first connecting portion 111 and the second connecting portion 112 and is disposed above the lower border 1022 at intervals for draining droplets on the lower border 1022. The plurality of draining ribs 113, the first connecting portion 111, and the second connecting portion 112 cooperatively form a U-shaped structure in a lateral view, for clamping the lower border 1022. In another embodiment, one of the first connecting portion 111 and the second connecting portion 112 can be omitted, and structure of the first connecting portion 111 or the second connecting portion 112 is not limited to a plate-shaped member shown in FIG. 3 of this embodiment. Structure that can fixedly connect the plurality of draining ribs 113 is included in the scope of the present invention.

Each of the plurality draining ribs 113 includes a first draining segment 1131, a second draining segment 1132, and a third draining segment 1133 which can be integrally connected to one another. When the fluid draining structure 11 clamps the lower border 1022 by the first connecting portion 111 and the second connecting portion 112, the first draining segment 1131 is located above a first surface 1022a of the lower border 1022, i.e., a surface of the aforementioned reflective layer or a surface of the aforementioned light guiding bar, and spaced from the first surface 1022a at a first distance D1. Preferably, in order to allow droplets to flow downwardly by gravity, the first surface 1022a and the first draining segment 1131 are downwardly inclined relative to a horizontal direction H.

In this embodiment, a width of each of the plurality of first draining segments 1131 can be substantially 1 mm or less for reducing a possibility of the plurality of first draining segments 1131 interfering with operation of the touch panel module 10. In this embodiment, any adjacent two of the plurality of first draining segments 1131 can be parallel to each other and spaced from each other at a second distance D2 of 10 mm substantially. In order to ensure draining capability and prevent interference with operation of the touch panel module 10, the second distance D2 can be, but not limited to, 8 mm to 12 mm substantially. Therefore, even if there is a droplet remaining on the first surface 1022a, a diameter of the droplet cannot be greater than 10 mm, which can prevent malfunction of the touch panel module 10 by downsizing the droplet. However, the plurality of first draining segments 1131 also can be not parallel to one another. In another embodiment, there can be some of the plurality of first draining segments 1131 parallel to one another as long as any two of the plurality of first draining segments 1131 are not connected to each other. The first distance D1 between the first draining segment 1131 and the first surface 1022a can be substantially greater than 0 mm and not greater than 1 mm. The first surface and a side of the first draining segment 1131 adjacent to the first surface 1022a can be parallel to each other, so that an effect of capillary phenomenon between the first surface 1022a and the side of the first draining segment 1131 adjacent to the first surface 1022a is more significant. However, it is not limited thereto.

Furthermore, an inclined angle 91 of the first surface 1022a relative to the horizontal direction H and an inclined angle 92 of the side of the first draining segment 1131 adjacent to the first surface 1022a relative to the horizontal direction H can be not greater than 10 degrees substantially. Therefore, it allows droplets to leave from the first surface 1022 by gravity and prevents attenuation of the touch signals caused by attenuation of the detecting light emitted or reflected from the lower border 1022 due to the excessive inclined angle thereof. However, it is not limited to this embodiment. It depends on practical demands.

Besides, the second draining segment 1132 is connected to the first draining segment 1131 and extends along a vertical direction V perpendicular to the horizontal direction H. The plurality of second draining segments 1132 is located on a second surface 1022b of the lower border 1022 adjacent to the first surface 1022a and connected to each other by the first connecting portion 111. The third draining segment 1133 is connected to another end of the first draining segment 1131 opposite to the end of the first draining segment 1131 and extends along the vertical direction V. The plurality of third draining segments 1133 is located on a third surface 1022c of the lower border 1022 adjacent to the first surface 1022a and opposite to the second surface 1022b and connected to each other by the second connecting portion 112. The first connecting portion 111 and the second connecting portion 112 can be disposed on the second surface 1022b and the third surface 1022c by a gluing or engaging manner, which achieves combination of the fluid draining structure 11 and the lower border 1022.

Figure 5:
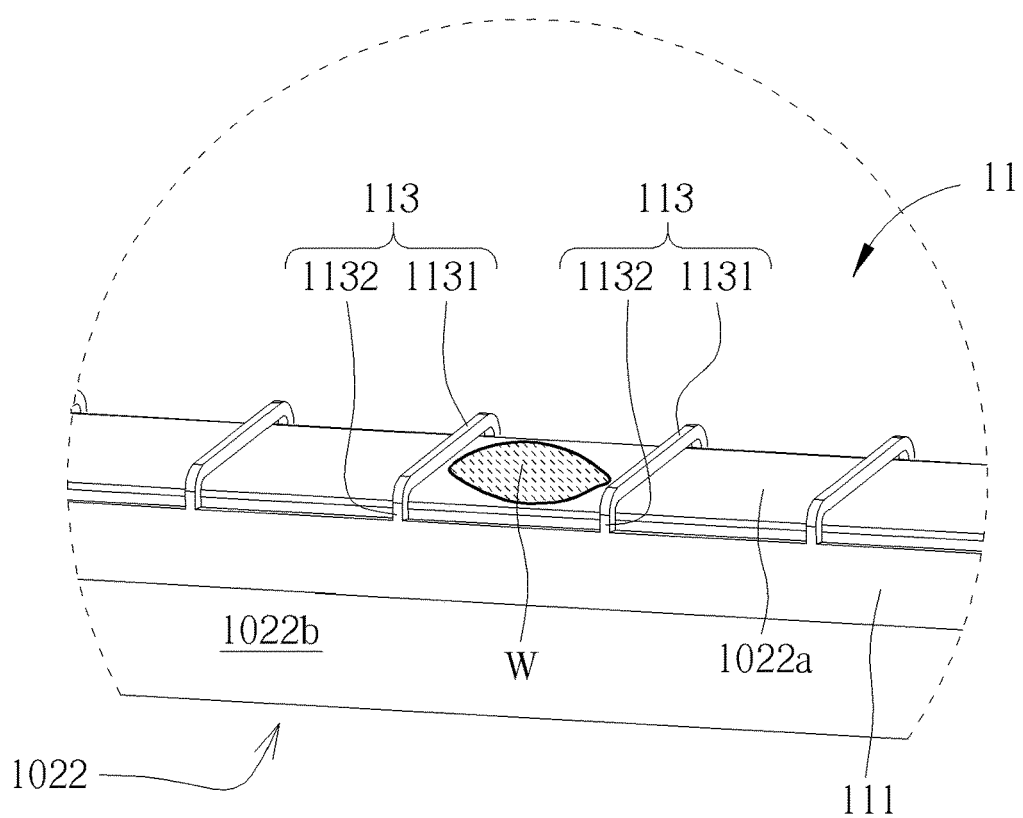
FIG. 5 and FIG. 6 are diagrams of the fluid draining structure in different states according to the first embodiment of the present invention.
Figure 6:
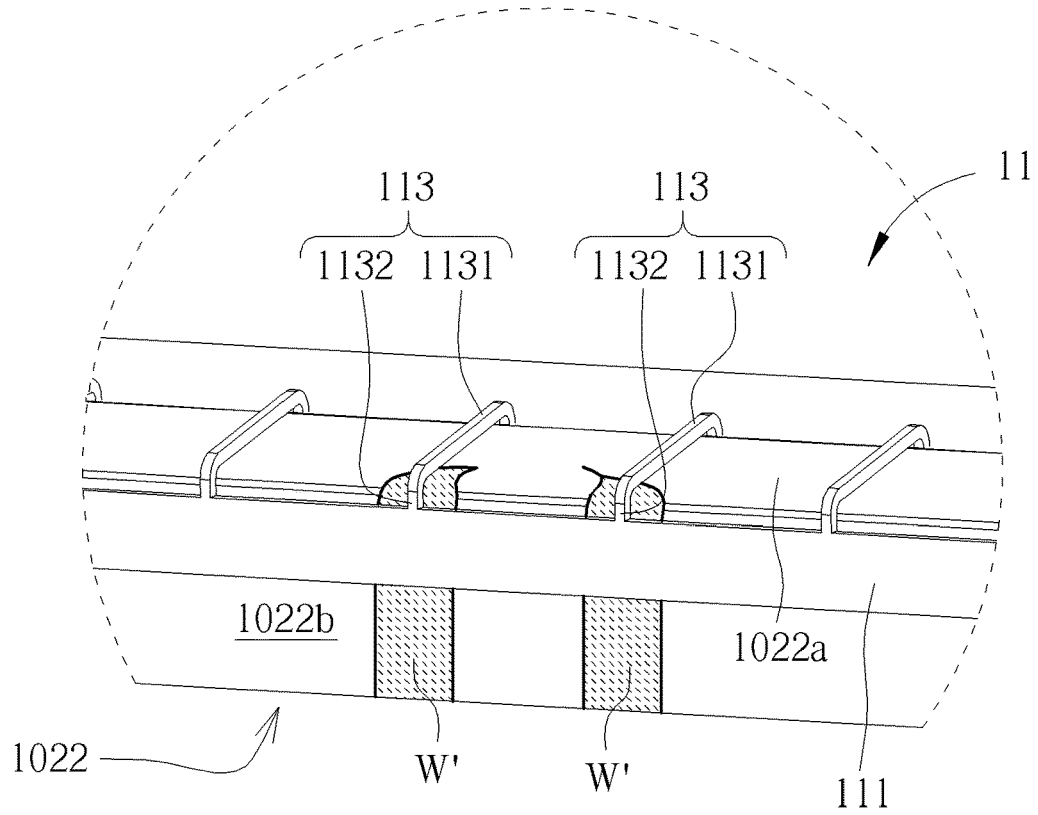

Please refer to FIG. 4 to FIG. 6. FIG. 5 and FIG. 6 are diagrams of the fluid draining structure 11 in different states according to the first embodiment of the present invention. For example, when there is a droplet falling on the first surface 1022a of the lower border 1022 and located at one of the plurality of first draining segments 1131 or located at a position near one of the plurality of first draining segments 1131, the droplet will be drawn to the one of the plurality of first draining segments 1131 by capillary phenomenon. Afterwards, the droplet is driven by gravity to flow from the inclined first draining segment 1131 to the first connecting portion 111 along the second draining segment 1132. On the other hand, when there is a large droplet W falling on a position as shown in FIG. 5, the large droplet W can be split into two small droplets W' as shown in FIG. 6 by capillary phenomenon between the two adjacent first draining segments 1131 and the first surface 1022a. In other words, the present invention can split the large droplet into several small droplets by capillary phenomenon for facilitating drainage of droplets. More specifically, as shown in FIG. 4 and FIG. 6, since the first surface 1022a and the side of the first draining segment 1131 adjacent to the first surface 1022a are downwardly inclined relative to the horizontal direction H, a component force generated by gravity is greater than an adhesive force between the droplet and the first surface 1022a. Therefore, the two small droplets W' can be driven by gravity to leave from the first surface 1022a to the corresponding second draining segments 1132 or the second surface 1022b, which achieves effective drainage of the droplet on the first surface 1022a of the lower border 1022. In such a way, the lower border 1022 can reflect light emitted from the light emitting components 103 to the light receiving components 104 normally, which ensures the touch panel module 10 to operate normally.

Figure 7:
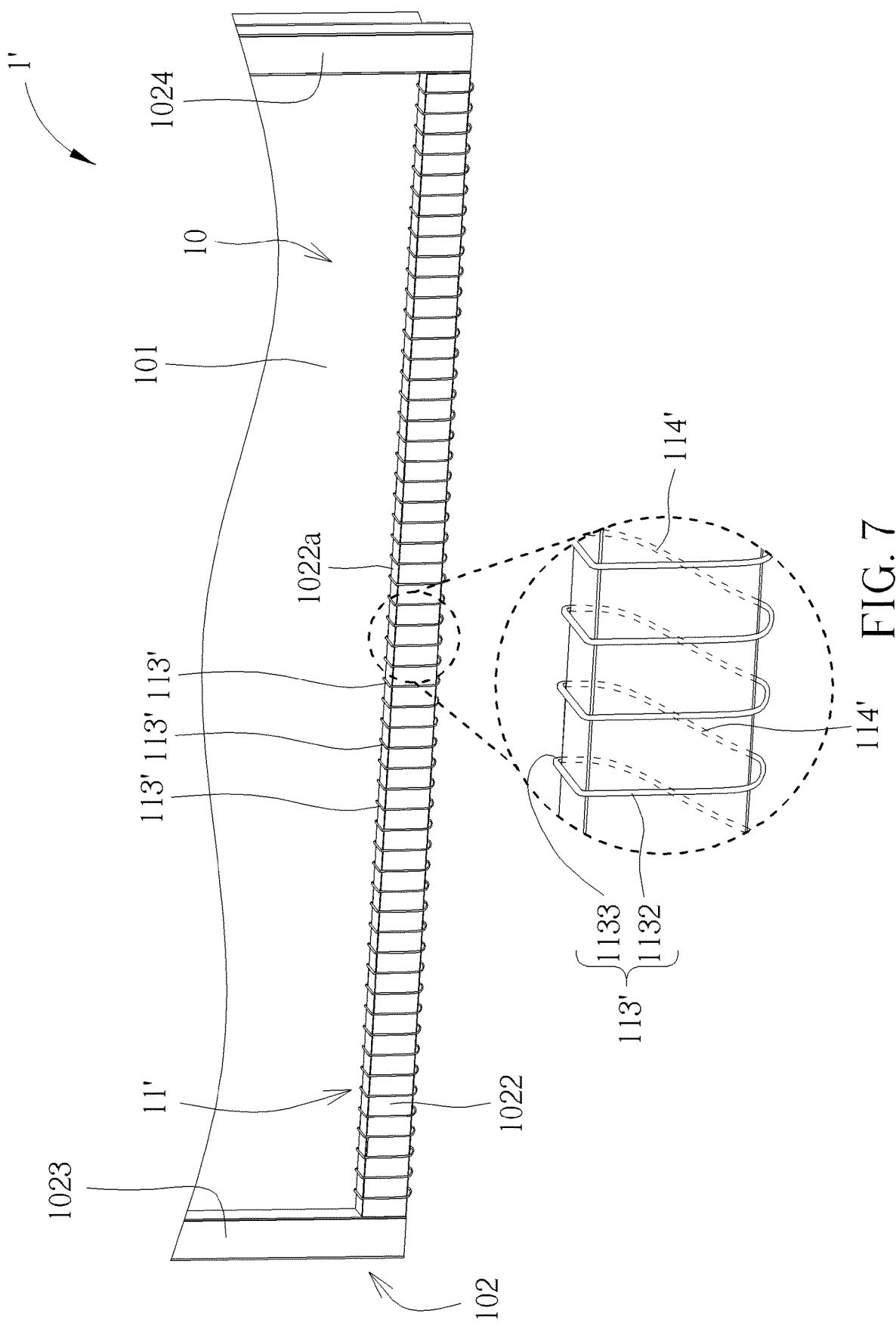
FIG. 7 is a partial structural diagram of a touch device according to a second embodiment of the present invention.

Please refer to FIG. 7. FIG. 7 is a partial structural diagram of a touch device 1' according to a second embodiment of the present invention. As shown in FIG. 7, the touch device 1' includes a fluid draining structure 11'. The fluid draining structure 11' includes a plurality of draining ribs 113'. Different from the fluid draining structure 11 of the first embodiment, the fluid draining structure 11' of this embodiment includes a plurality of connecting portions 114' instead of the aforementioned plate-shaped first connecting portion 111 and the second connecting portion 112 of the first embodiment. Each of the plurality of connecting portions 114' is connected between the corresponding second draining segment 1132 and the corresponding third draining segment 1133 of the two adjacent draining ribs 113', so that the fluid draining structure 11' forms a coil-shaped structure wrapping around the border continuously. Operational principle of the fluid draining structure 11' of this embodiment is similar to the one of the first embodiment, which drains droplets on the first surface 1022a by gravity and capillary phenomenon between the plurality of draining ribs 113' and the first surface 1022a of the lower border 1022. Detailed description is omitted herein for simplicity.

Figure 8:
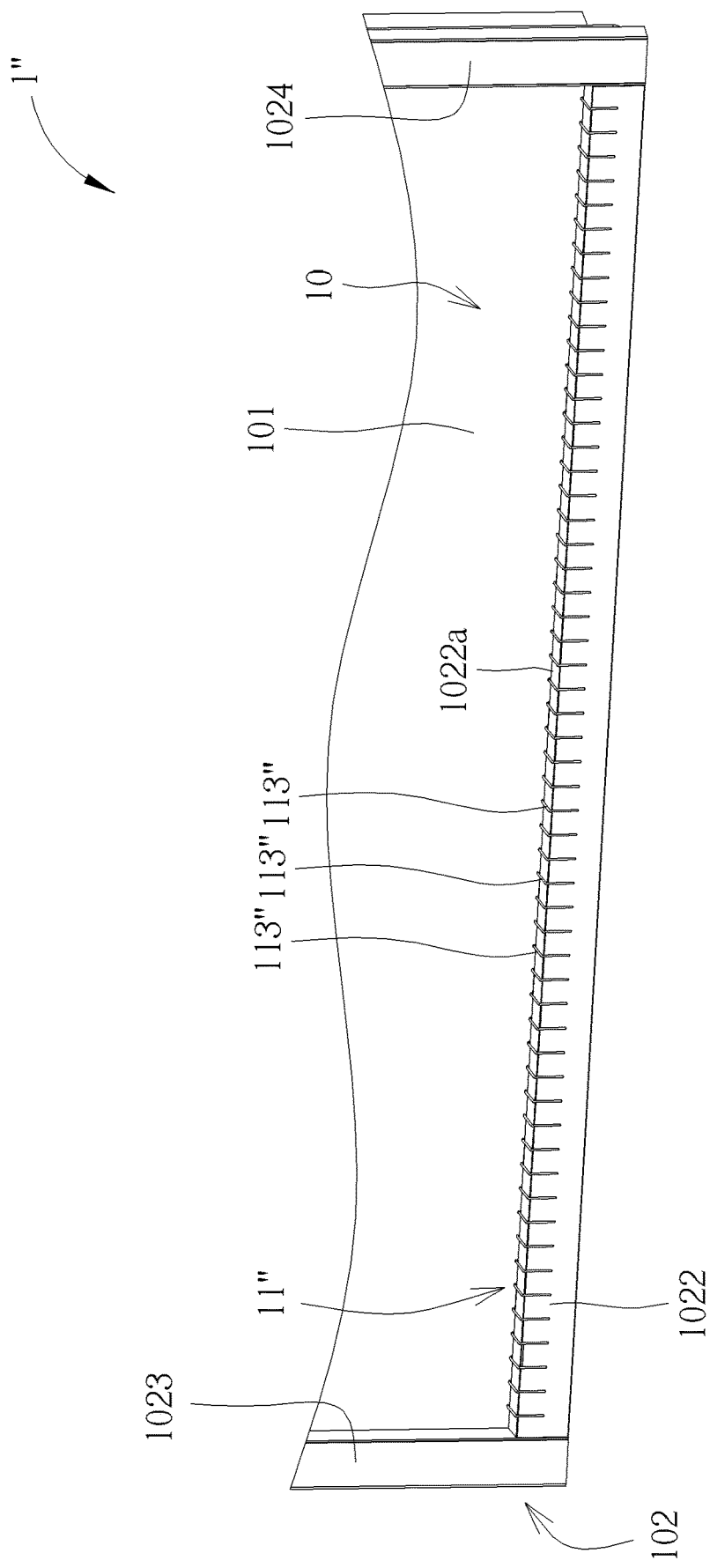
FIG. 8 is a partial structural diagram of a touch device according to a third embodiment of the present invention.

Please refer to FIG. 8. FIG. 8 is a partial structural diagram of a touch device 1" according to a third embodiment of the present invention. As shown in FIG. 8, a fluid draining structure 11" of the third embodiment can only include a plurality of draining ribs 113". The plurality of draining ribs 113 is separated and not connected to one another by any connection portion. In other words, the plurality of the draining ribs 113" is independently disposed on the lower border 1022 for draining droplets on the first surface 1022a in an arrangement similar to the one of the first embodiment.

In contrast to the prior art, the fluid draining structure of the present invention drains droplets on the border by gravity and capillary phenomenon generated between the plurality of draining ribs and the border, which prevents malfunction of the touch panel module caused by droplets on the border. Therefore, the touch device of the present invention can be placed outdoors. Even if there is rain or water spilled on the touch device, the touch panel module can operate normally by drainage of droplets on the border.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fluid draining structure adapted for a border having a first surface, and the fluid draining structure comprising:
a plurality of draining ribs spaced at intervals on the border, each of the plurality of draining ribs comprising:
a first draining segment located above the first surface and spaced from the first surface at a first distance, the first surface and a side of the first draining segment adjacent to the first surface being inclined downwardly relative to a horizontal direction;
wherein when a droplet falls on the first surface, the droplet is drawn to a corresponding draining rib of the plurality of draining ribs and drained along the corresponding draining rib of the plurality of draining ribs.

2. The fluid draining structure of claim 1, wherein the first distance is substantially greater than 0 mm and not greater than 1 mm.

3. The fluid draining structure of claim 1, wherein an inclined angle of the first surface relative to the horizontal direction and an inclined angle of the side of the first draining segment adjacent to the first surface relative to the horizontal direction are substantially not greater than 10 degrees.

4. The fluid draining structure of claim 1, wherein first draining segments of any adjacent two of the plurality of draining ribs are spaced from each other at a second distance, and the second distance is substantially from 8 mm to 12 mm.

5. The fluid draining structure of claim 1, wherein a width of the first draining segment of each of the plurality of draining ribs is not greater than 1 mm.

6. The fluid draining structure of claim 1, wherein the side of the first draining segment adjacent to the first surface is substantially parallel to the first surface.

7. The fluid draining structure of claim 1, wherein each of the plurality of draining ribs further comprises a second draining segment connected to an end of the first draining segment and extending along a vertical direction substantially perpendicular to the horizontal direction, and the second draining segment is located on a second surface of the border adjacent to the first surface of the border.

8. The fluid draining structure of claim 7, further comprising a first connecting portion, second draining segments of the plurality of draining ribs being connected together by the first connecting portion.

9. The fluid draining structure of claim 7, wherein each of the plurality of draining ribs further comprises a third draining segment connected to another end of the first draining segment opposite to the end of the first draining segment and extending along the vertical direction, and the third draining segment is located on a third surface of the border adjacent to the first surface and opposite to the second surface.

10. The fluid draining structure of claim 9, further comprising a second connecting portion, third draining segments of the plurality of draining ribs being connected together by the second connecting portion.

11. The fluid draining structure of claim 1, further comprising at least one connecting portion, the plurality of draining ribs being connected to each other by the at least one connecting portion.

12. The fluid draining structure of claim 1, wherein the plurality of draining ribs are independent and spaced at intervals on the border.

13. The fluid draining structure of claim 1, wherein the plurality of draining ribs are connected one by one to form a coil-shaped structure and wrap around the border continuously.

14. A touch device comprising:
a touch panel module comprising a display panel, a frame surrounding a periphery of the display panel, and at least one touch detecting module, the frame comprising a lower border having a first surface; and
a fluid draining structure for draining fluid accumulated on the lower border, and the fluid draining structure comprising:
a plurality of draining ribs spaced at intervals on the lower border, each of the plurality of draining ribs comprising:
a first draining segment located above the first surface and spaced from the first surface at a first distance, the first surface and a side of the first draining segment adjacent to the first surface being inclined downwardly relative to a horizontal direction;
wherein when a droplet falls on the first surface, the droplet is drawn to a corresponding draining rib of the plurality of draining ribs and drained along the corresponding draining rib of the plurality of draining ribs.

15. The touch device of claim 14, wherein the first distance is substantially greater than 0 mm and not greater than 1 mm.

16. The touch device of claim 14, wherein an inclined angle of the first surface relative to the horizontal direction and an inclined angle of the side of the first draining segment adjacent to the first surface relative to the horizontal direction are substantially not greater than 10 degrees.

17. The touch device of claim 14, wherein first draining segments of any adjacent two of the plurality of draining ribs are spaced from each other at a second distance, and the second distance is substantially from 8 mm to 12 mm.

18. The touch device of claim 14, wherein a width of the first draining segment of each of the plurality of draining ribs is not greater than 1 mm.

19. The touch device of claim 14, wherein the side of the first draining segment adjacent to the first surface is substantially parallel to the first surface.

20. The touch device of claim 14, wherein each of the plurality of draining ribs further comprises a second draining segment connected to an end of the first draining segment and extending along a vertical direction substantially perpendicular to the horizontal direction, and the second draining segment is located on a second surface of the lower border adjacent to the first surface of the lower border.

21. The touch device of claim 20, wherein the fluid draining structure further comprises a first connecting portion, second draining segments of the plurality of draining ribs are connected together by the first connecting portion.

22. The touch device of claim 20, wherein each of the plurality of draining ribs further comprises a third draining segment connected to another end of the first draining segment opposite to the end of the first draining segment and extending along the vertical direction, and the third draining segment is located on a third surface of the lower border adjacent to the first surface and opposite to the second surface.

23. The touch device of claim 22, wherein the fluid draining structure further comprises a second connecting portion, third draining segments of the plurality of draining ribs are connected together by the second connecting portion.

24. The touch device of claim 14, wherein the draining further comprises at least one connecting portion, the plurality of the draining ribs is connected to each other by the at least one connecting portion.

25. The touch device of claim 14, wherein the plurality of draining ribs are independent and spaced at intervals on the lower border.

26. The touch device of claim 14, wherein the plurality of draining ribs are connected one by one to form a coil-shaped structure and wrap around the lower border continuously.

\* \* \* \* \*

UNITED STATES PATENT AND TRADEMARK OFFICE
CERTIFICATE OF CORRECTION

PATENT NO. : 10,588,224 B2
APPLICATION NO. : 15/805108
DATED : March 10, 2020
INVENTOR(S) : Chia-Chang Hou et al.

Page 1 of 1

It is certified that error appears in the above-identified patent and that said Letters Patent is hereby corrected as shown below:

On the Title Page

Item (73), correct the name of the assignee from "Winston Corporation" to --Wistron Corporation--.

Signed and Sealed this
Twenty-first Day of April, 2020

Andrei Iancu
*Director of the United States Patent and Trademark Office*